(12) United States Patent
Kapusta et al.

(10) Patent No.: US 10,660,208 B2
(45) Date of Patent: May 19, 2020

(54) EMBEDDED DRY FILM BATTERY MODULE AND METHOD OF MANUFACTURING THEREOF

(71) Applicant: General Electric Company, Schenectady, NY (US)

(72) Inventors: Christopher James Kapusta, Delanson, NY (US); Kaustubh Ravindra Nadarkar, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 674 days.

(21) Appl. No.: 15/209,244

(22) Filed: Jul. 13, 2016

(65) Prior Publication Data

US 2018/0020548 A1    Jan. 18, 2018

(51) Int. Cl.
*H05K 3/40* (2006.01)
*H05K 3/32* (2006.01)
(Continued)

(52) U.S. Cl.
CPC .......... *H05K 1/185* (2013.01); *H01L 21/486* (2013.01); *H01L 21/565* (2013.01);
(Continued)

(58) Field of Classification Search
CPC .. H05K 1/185; H05K 1/0298; H01L 23/5389; H01L 23/3121; H01M 6/40
See application file for complete search history.

(56) References Cited

U.S. PATENT DOCUMENTS 6,077,106 A      6/2000 Mish
7,843,056 B2 *  11/2010 Smeys ................ H01L 21/4853
                                                257/415
(Continued)

FOREIGN PATENT DOCUMENTS

CN      1241041 A      1/2000
EP    2 916 354 A2    9/2015

OTHER PUBLICATIONS

Extended European Search Report and Opinion issued in connection with corresponding EP Application No. 17174808.0 dated Aug. 25, 2017.
(Continued)

*Primary Examiner* — Nathan Milakovich
(74) *Attorney, Agent, or Firm* — Ziolkowski Patent Solutions Group, SC

(57) ABSTRACT

A system and method for providing a packaged electronics module having a dry film battery incorporated therein is disclosed. The packaged electronics module includes a first dielectric layer, at least one electronic component attached to or embedded in the first dielectric layer, a dry film battery formed on the first dielectric layer, and metal interconnects mechanically and electrically coupled to the at least one electronic component and the dry film battery to form electrical interconnections thereto. Electronic components in the form of a MEMS type sensor, semiconductor device and communications device may be included in the module along with the battery to provide a self-powered module capable of communicating with other like packaged electronics modules.

12 Claims, 9 Drawing Sheets

(51) Int. Cl.

| | | |
|---|---|---|
| *H05K 1/18* | (2006.01) | |
| *H01M 6/40* | (2006.01) | |
| *H01M 10/0585* | (2010.01) | |
| *H01M 10/0562* | (2010.01) | |
| *H01L 23/58* | (2006.01) | |
| *H01L 23/538* | (2006.01) | |
| *H01L 23/31* | (2006.01) | |
| *H01L 23/00* | (2006.01) | |
| *H01M 10/04* | (2006.01) | |
| *H01M 2/20* | (2006.01) | |
| *H01M 10/42* | (2006.01) | |
| *H01L 21/48* | (2006.01) | |
| *H01L 21/56* | (2006.01) | |
| *H01L 23/66* | (2006.01) | |
| *H05K 1/02* | (2006.01) | |
| *H05K 1/11* | (2006.01) | |
| *H01M 10/0587* | (2010.01) | |
| *H01L 25/16* | (2006.01) | |
| *H01M 10/052* | (2010.01) | |

(52) U.S. Cl.
CPC ...... *H01L 23/3121* (2013.01); *H01L 23/5383* (2013.01); *H01L 23/5384* (2013.01); *H01L 23/5389* (2013.01); *H01L 23/58* (2013.01); *H01L 23/66* (2013.01); *H01L 24/00* (2013.01); *H01L 24/19* (2013.01); *H01L 24/20* (2013.01); *H01L 24/32* (2013.01); *H01L 24/83* (2013.01); *H01M 2/20* (2013.01); *H01M 10/0436* (2013.01); *H01M 10/0585* (2013.01); *H01M 10/425* (2013.01); *H05K 1/0298* (2013.01); *H05K 1/115* (2013.01); *H05K 3/32* (2013.01); *H05K 3/4038* (2013.01); *H01L 25/16* (2013.01); *H01L 2223/6677* (2013.01); *H01L 2224/04105* (2013.01); *H01L 2224/24137* (2013.01); *H01L 2224/32225* (2013.01); *H01L 2224/83192* (2013.01); *H01L 2224/92144* (2013.01); *H01L 2924/1421* (2013.01); *H01L 2924/1461* (2013.01); *H01M 6/40* (2013.01); *H01M 10/052* (2013.01); *H01M 10/0562* (2013.01); *H01M 10/0587* (2013.01); *H01M 2220/30* (2013.01); *H05K 2201/10037* (2013.01); *H05K 2201/10098* (2013.01); *H05K 2201/10151* (2013.01); *H05K 2203/1316* (2013.01); *H05K 2203/1327* (2013.01)

(56) References Cited

U.S. PATENT DOCUMENTS

| | | | |
|---|---|---|---|
| 8,187,920 B2* | 5/2012 | Mohan | H01L 21/4853 |
| | | | 257/E21.499 |
| 8,283,657 B2 | 10/2012 | La Rosa et al. | |
| 8,394,522 B2 | 3/2013 | Snyder et al. | |
| 8,599,572 B2 | 12/2013 | Neudecker et al. | |
| 8,830,685 B2 | 9/2014 | La Rosa | |
| 9,012,264 B2 | 4/2015 | Hundt et al. | |
| 9,224,684 B2* | 12/2015 | Kubota | H01L 23/58 |
| 10,014,710 B2* | 7/2018 | Cheah | H02J 50/10 |
| 10,044,009 B2* | 8/2018 | Fallourd | H01M 2/06 |
| 10,236,480 B2* | 3/2019 | Fallourd | H01M 2/06 |
| 2010/0019370 A1* | 1/2010 | Pressel | B81B 7/02 |
| | | | 257/690 |
| 2013/0329373 A1* | 12/2013 | Smith | H01L 23/13 |
| | | | 361/728 |
| 2015/0084157 A1* | 3/2015 | Tegen | H01L 21/822 |
| | | | 257/528 |
| 2017/0018810 A1* | 1/2017 | Ladroue | H01M 4/0404 |

OTHER PUBLICATIONS

Nookala et al., "Preparation and characterization of a hybrid solid polymer electrolyte consisting of poly(ethyleneoxide) and poly(acrylonitrile) for polymer-battery application", Energy Conversion Engineering Conference, 1997. IECEC-97., Proceedings of the 32nd Intersociety, vol. 1, pp. 13-18, Jul. 27-Aug. 1, 1997, Honolulu, HI.

"Embedded Energy", CYMBET Corporation, http://www.cymbet.com/products/embedded-energy.php, Retrieved on Apr. 28, 2016.

"EnerChip™ Smart Solid State Batteries", CYMBET Corporation, http://www.cymbet.com/products/enerchip-solid-state-batteries.php, Retrieved on Apr. 28, 2016.

* cited by examiner

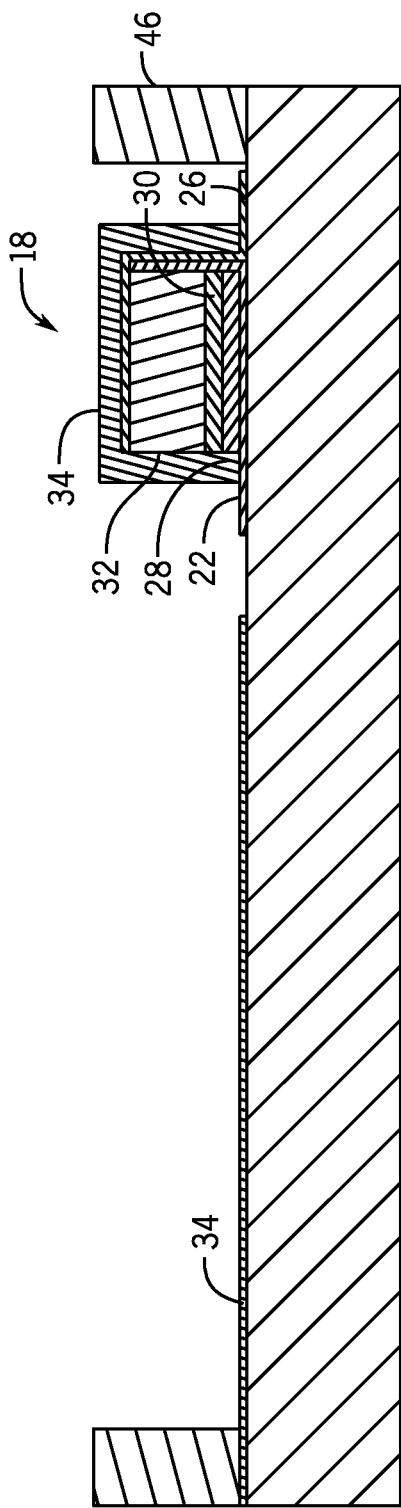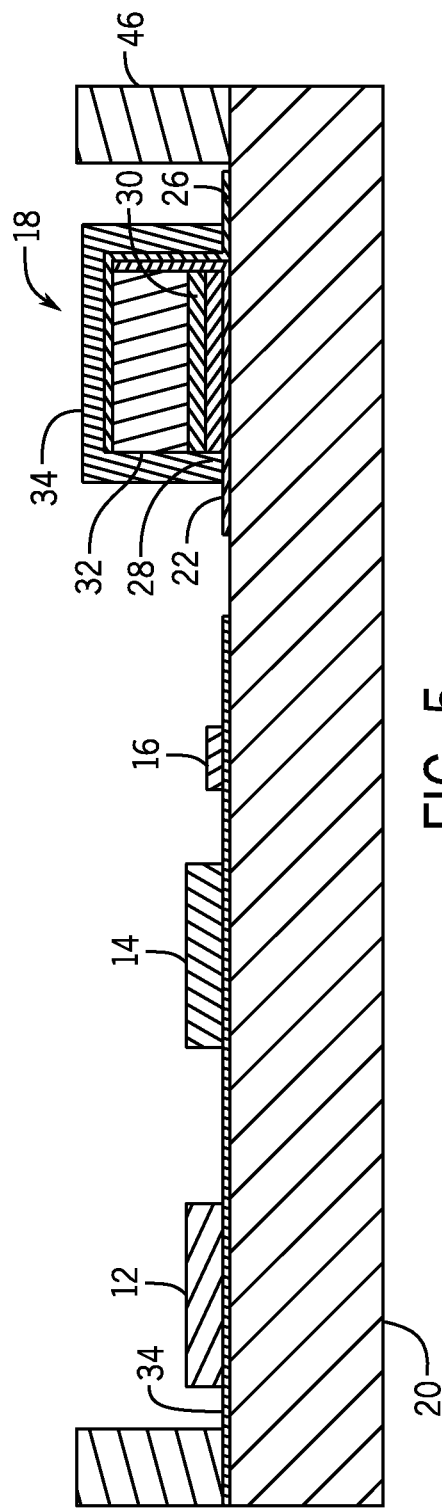

EMBEDDED DRY FILM BATTERY MODULE AND METHOD OF MANUFACTURING THEREOF

BACKGROUND OF THE INVENTION

Embodiments of the invention relate generally to structures and methods for packaging electrical components such as semiconductor devices, sensors and communications devices and, more particularly, to an embedded package structure having a dry film battery incorporated therein so as to form a self-powered module.

Electronics packaging is a method for constructing electronic circuits packages or modules in which one or more semiconductor devices and passive devices are incorporated within a package structure that provides electrical connections and protection to the devices—such that a "multi-chip module" (MCM) might be provided, for example. The package structure then enables connection of the package/module to the surface of printed circuit boards (PCBs) or other similar external circuits, for example. The technique for packaging semiconductor devices and passive devices typically begins with placement of one or more semiconductor or passive devices onto a dielectric layer by way of an adhesive, with the dielectric layer covering the active side of each device. Metal interconnects are then electroplated onto the dielectric layer to form a direct metallic connection to the device(s). The interconnects may be routed through additional laminate re-distribution layers, if desired, and an input/output system is provided to enable surface mounting of the package onto the PCB or external circuit. An embedding compound may then be applied about the device(s) to encapsulate the device(s) therein.

More recently, it has been recognized that electronics packages/modules as described above might be utilized in building systems where multiple packaged sensors communicate with each other. These systems may be called "Internet of Things", or IoT, systems, wherein the system enabler is an IC device which may provide at least three functions: a sensing capability, a digital and signal processing capability, and communication capability. For example, the sensing capability may include a region or regions, layer or layers within the IC device which may include, for example, a microelectromechanical system (MEMS) accelerometer (single or multi-axis), gas sensor, electric or magnetic field sensor, resonant structures, cantilever structures, ultrasonic transducers (capacitive & piezoelectric), etc. Digital and signal processing capability may include a region or regions, layer or layers within the IC device which may include, for example, a microprocessor, digital signal processor, microcontroller, FPGA, and other digital and/or analog logic circuits, devices, and subsystems. Communication capability, such as communication from at least one IC of an IoT system to another, or to a host controller/nexus node, may include a region or regions, layer or layers within the IC device which may include, for example, an RF circuit and antenna or antennas for wireless communication which might utilize standard wireless communication protocols such as G4, WiFi or Bluetooth, I/O buffers and either mechanical bond pads/wires and/or optical devices/transistors for optical communication, transmitters, receivers, codecs, DACs, digital or analog filters, modulators.

It is recognized that electronics packages of an IoT systems—and more specifically the sensors, processors/dies, and communication devices therein—require power in order to operate. Typically, a stand-alone battery or other external power source is utilized to provide power to the IoT electronics package or other MCM, with the battery being mounted to a PCB or external device and being wired to the package/module to provide power thereof. Connection of such a stand-alone battery to the package/module thus makes achieving a small form factor very challenging and may limit the environments/applications in which the package/module might be employed.

Therefore, it would be desirable to provide an electronics package or module having a battery incorporated therein, so as to provide a self-powered module having a small form factor. It would further be desirable for such an electronics package or module to be manufactured within and as part of the overall package build-up process in a panel format and at low cost.

BRIEF DESCRIPTION OF THE INVENTION

Embodiments of the invention are directed to an embedded package structure having a dry film battery incorporated therein and method of fabrication thereof.

In accordance with one aspect of the invention, a packaged electronics module includes a first dielectric layer, at least one electronic component attached to or embedded in the first dielectric layer, a dry film battery formed on the first dielectric layer, and metal interconnects mechanically and electrically coupled to the at least one electronic component and the dry film battery to form electrical interconnections thereto.

In accordance with another aspect of the invention, a method of manufacturing a packaged electronics module includes providing a first dielectric layer, forming a dry film battery directly onto the first dielectric layer, attaching one or more electronic components to the first dielectric layer, forming a plurality of vias through the first dielectric layer, and forming metal interconnects in the plurality of vias formed through the first dielectric layer, the metal interconnects forming electrical interconnections to the one or more electronic components and to the dry film battery.

In accordance with yet another aspect of the invention, a packaged electronics module includes a dielectric layer having a first surface and a second surface and a plurality of electronic components attached to the dielectric layer on the first surface, the plurality of electronic components including a MEMS type sensor and a communications chip set including a semiconductor device and a communications device. The packaged electronics module also includes a dry film battery attached to the dielectric layer on the first surface and metal interconnects formed in a plurality of vias formed through the dielectric layer and out onto the second surface of the dielectric layer, the metal interconnects being mechanically and electrically coupled to the MEMS type sensor the communications chip set. The packaged electronics module further includes an electrically insulating substrate applied onto the first surface of the dielectric layer and over the MEMS type sensor the communications chip set, so as to embed the MEMS type sensor the communications chip set therein.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIGS. 2-10 are schematic cross-sectional side views of a packaged module during various stages of a manufacturing/build-up process according to an embodiment of the invention.

DETAILED DESCRIPTION

Embodiments of the invention provide for an embedded dry film battery module having a battery formed therein directly on a dielectric substrate via a dry film sputtering and evaporating technique.

Figure 1A:
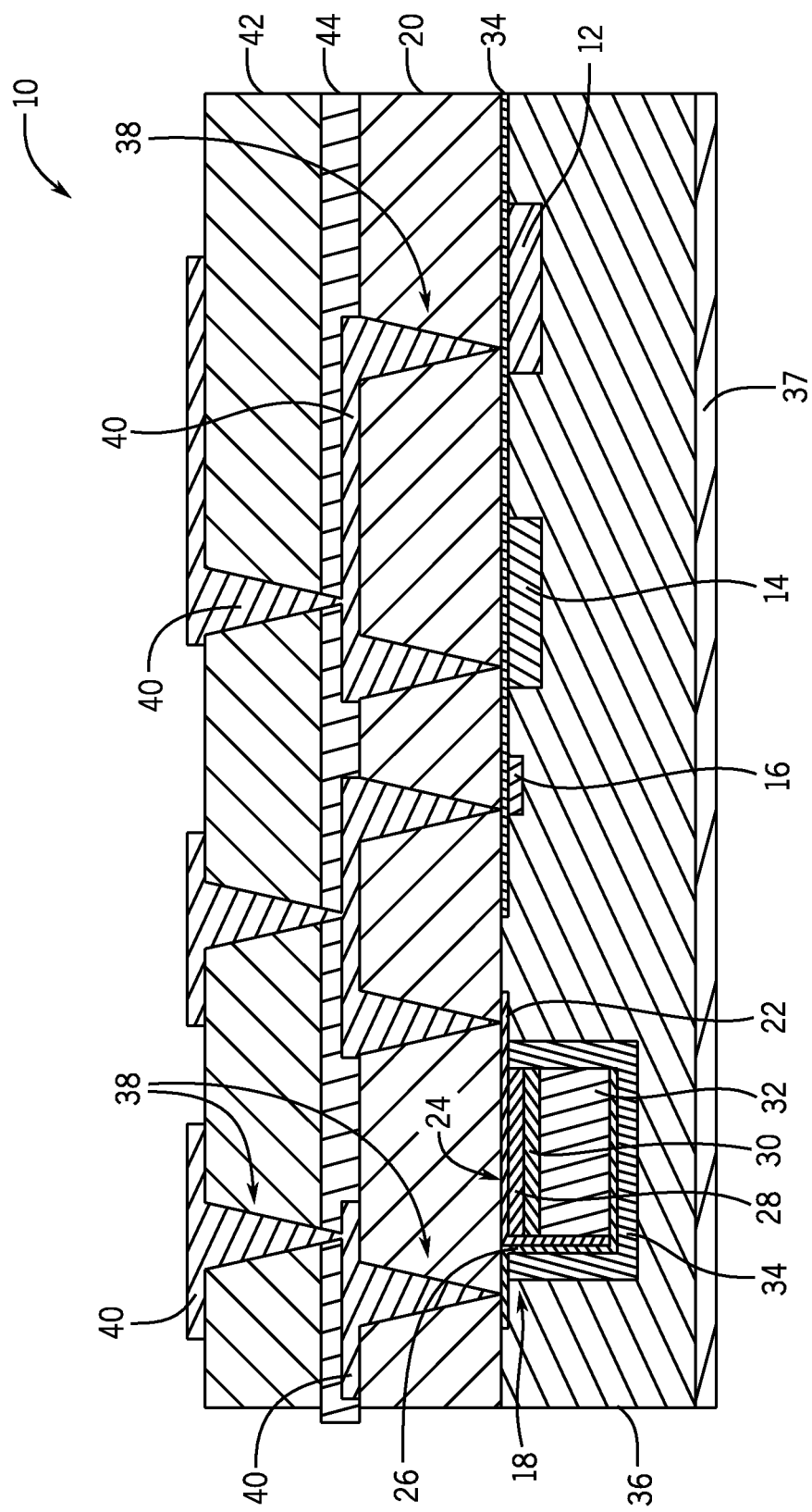
FIGS. 1A and 1B are schematic cross-sectional side views of a packaged module according to embodiments of the invention.
Figure 1B:
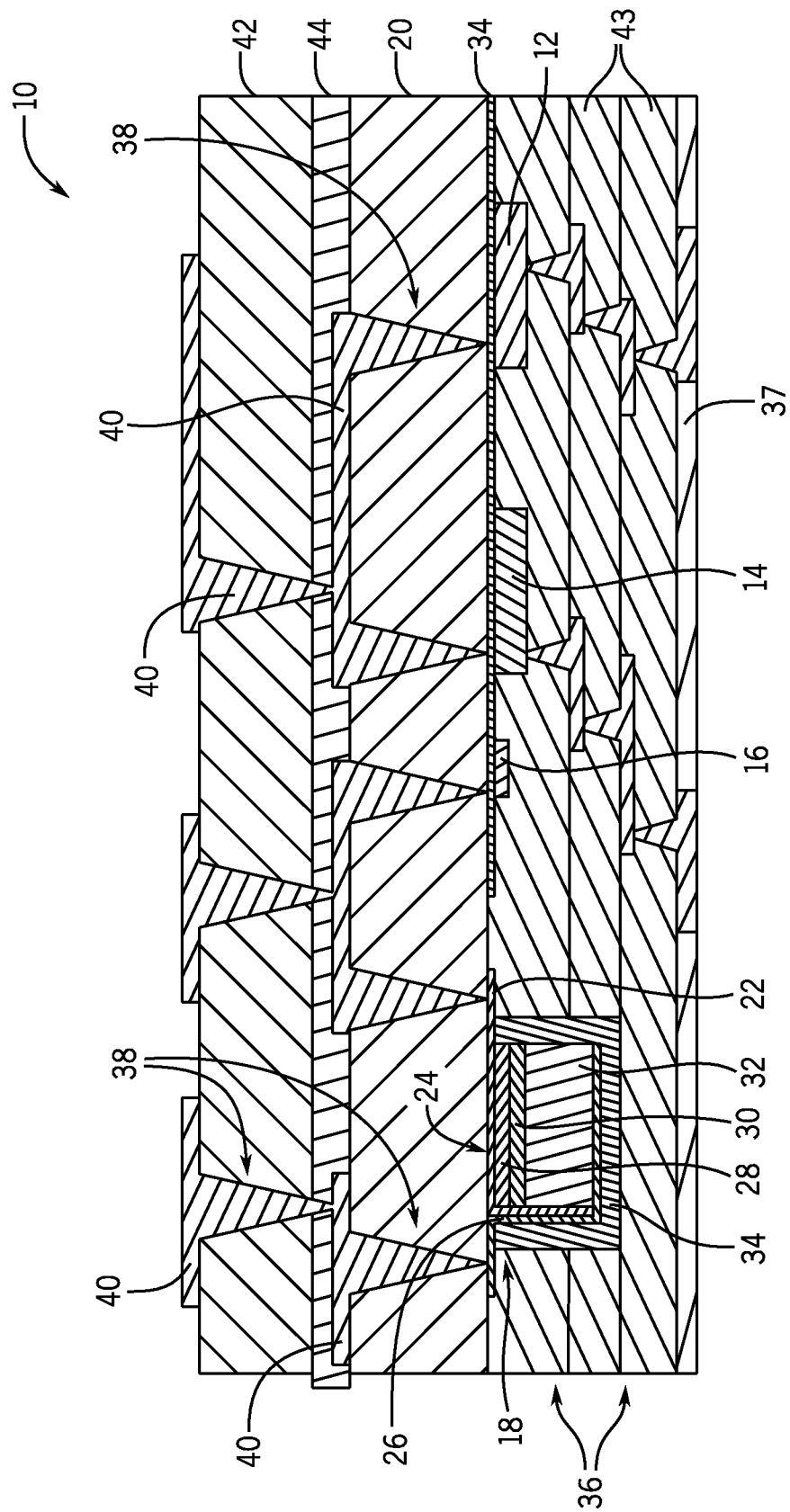

Referring to FIGS. 1A and 1B, a packaged electronics module 10 are shown according to embodiments of the invention. The packaged modules 10 include a number of electronic components 12, 14, 16 therein, as well as a dry film battery 18. In the illustrated embodiments, the components 12, 14, 16 are in the form of a microelectromechanical system (MEMS) type sensor 12 and a semiconductor device 14 and communications device 16 that collectively form a means for wireless data communication. The MEMS sensor 12 may be any type of sensing device that is suitable for an intended use of the packaged module 10, with a MEMS accelerometer, gas sensor, or electric/magnetic field sensor being examples of such sensors. The semiconductor device 14 may be in the form of a die, chip, application specific integrated circuit (ASIC), or processor, for example, and the communications device 16 may be in the form of an RF circuit and antenna(s) that might utilize standard wireless communication protocols such as G4, WiFi or Bluetooth, for example. Thus, in one embodiment, the semiconductor device 14 and communications device 16 might collectively form a Bluetooth wireless chip set. While a specific arrangement of electronic components 12, 14, 16 is shown in FIG. 1, it is recognized that additional semiconductor devices or electronic components could be included in the packaged module 10, and thus embodiments of the invention are not limited to the specific embodiments illustrated in FIGS. 1A and 1B.

As shown in FIGS. 1A and 1B, the dry film battery 18 and each of electronic components 12, 14, 16 are formed/provided on a dielectric layer 20 of the packaged module 10. According to an exemplary embodiment, the dielectric layer 20 is provided in the form of a lamination or film and is formed of a material that is chosen to provide mechanical and temperature stability to vias during use and frame processing, as well as provide suitable dielectric properties and voltage breakdown strength and processability for via formation and power overly (POL) processing. Accordingly, the dielectric layer 20 may be formed of one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material, according to embodiments of the invention.

In FIGS. 1A and 1B, it can be seen that dry film battery 18 is provided directly onto dielectric layer 20. In an exemplary embodiment, the dry film battery 18 is formed directly onto the dielectric layer 20 via a fabrication process described herebelow; however, it is recognized that other embodiments of the invention may be directed to packages where an already fabricated battery 18 is placed onto dielectric layer 20. In an embodiment where the dry film battery 18 is formed directly onto the dielectric layer 20, an anode electrode 22 of the battery 18 is first deposited and defined on the dielectric layer 20 via a sputtering and evaporating technique, a dry film electrolyte structure 24 is then deposited onto the anode 22, and a cathode electrode 26 is then deposited and defined over the dry film electrolyte structure 24. In an exemplary embodiment, the battery 18 is in the form of a thin film lithium microbattery, and thus fabrication of the battery 18 includes steps of depositing/defining a lithium anode electrode 22 onto the dielectric layer 20, applying a base layer of lithium 28 onto the anode 22, depositing dry film electrolytes of LiPON 30 and $LiCoO_2$ 32 onto the base layer of lithium 28, and depositing/defining a lithium cathode electrode 26 over the stacked layers of dry film electrolytes 24. It is recognized, however, that battery 18 may be another suitable type of dry film battery besides a lithium battery, and thus embodiments of the invention are not limited only to thin film lithium batteries.

For securing electronic components 12, 14, 16 onto dielectric layer 20, an adhesive material 34 (i.e., an "attachment adhesive") is included on the dielectric layer 20—with the electronic components 12, 14, 16 being attached face down onto the adhesive 34. The adhesive material 34 is also applied over the dry film battery 18 to serve as a protective coating or encapsulant for the battery. An electrically insulating substrate 36 is also provided in packaged module 10 and is formed so as to surround the electronic components 12, 14, 16 and battery 18, so as to provide protection thereto and provide additional structural integrity to the packaged module 10. In the embodiment illustrated in FIG. 1A, the electrically insulating substrate 36 is provided in the form of a dielectric "overmold" encapsulant, such as a polymeric encapsulant or epoxy. However, it is recognized that the electrically insulating substrate 36 could instead be provided in other alternative forms, such as being provided as a multi-layer dielectric construction (i.e., a stack of dielectric layers) applied and formed around the components 12, 14, 16 and battery 18, as shown in FIG. 1B, with it being recognized that such a multi-layer dielectric construction would also allow for other routing layers to be formed in such layers and provide an electrical path to the other/back side of the packaged module 10. In either embodiment, the electrically insulating substrate 36 is formed to present a level or planar back surface for the packaged module 10, and an outer adhesive layer 37 may be applied onto the back side of the electrically insulating substrate 36 to enable "peel and stick" applications for the packaged module 10 onto a desired device with which the packaged module 10 is to be employed.

As shown in FIGS. 1A and 1B, a plurality of vias 38 and patterned metal interconnects 40 are formed in and on the dielectric layer 20. The vias 38 are formed through dielectric layer 20 down to a front/active surface of the electronic components 12, 14, 16 and to the anode 22 and cathode 26 (i.e., terminals) of dry film battery 18. Metal interconnects 40 are subsequently formed in the packaged module 10 to provide electrical connections therein, with the interconnects 40 being formed in the vias 38 and out onto a surface of dielectric layer 20. According to embodiments of the invention, the metal interconnects 40 comprise "POL interconnects" that are formed as robust electroplated copper interconnects that form direct electrical connections in the device 12. Depending on the metallization on the device, in some embodiments, a sputtered adhesion layer (titanium, chromium, etc.) is provided along with a sputtered copper seed layer on which copper can be plated. As shown in FIG.

1, the metal interconnects 40 are patterned and etched to a desired shape, such as to provide for electrical connections to packaged module 10.

According to one embodiment, an additional dielectric layer 42 is applied to dielectric layer 20 (by way of an adhesive layer 44). Thus, upon forming of the metal interconnects 40 in/on dielectric layer, additional dielectric layer 42 is added to dielectric layer 20. Vias 38 are then subsequently drilled in the added dielectric layer 42, with metal interconnects 40 being plated in the vias 38 and patterned on an outer surface of the layer 42. The dielectric layers 20, 42 serve as redistribution layers that serve to route electrical connections within the packaged module 10. While not shown in FIGS. 1A and 1B, it is recognized that—in some embodiments—package I/Os can be provided on the topmost redistribution layer (i.e., layer 42), such as in the form of a ball grid array (BGA), to provide a second level connection to a printed circuit board (PCB) or other external device.

In the embodiment, of FIG. 1B, it is recognized that vias 38 and metal interconnects 40 may be formed in/on the stack of dielectric layers 43 that form the electrically insulating substrate 36 in the same fashion as described above for the vias 38 and interconnects 40 formed in dielectric layers 20, 42. As previously mentioned, the interconnects 40 could provide an electrical path to the back side of the packaged module 10.

According to one embodiment, antenna structures (not shown) can be formed and routed in the redistribution layers 20, 42 (and/or in dielectric layers 43). The antenna structures can provide enhanced signal reception and transmission from the communications device 16 included in packaged module 10.

A packaged module 10 is thus provided having a battery 18 integrated therein that is formed on a common substrate (i.e., dielectric layer 20) along with other electronic components 12, 14, 16. The packaged module 10 is thus in the form of a self-powered module with very low losses and a thin profile. The packaged module 10 can be designed to provide a number of functions or sensing applications, such as for IoT applications where the module includes integrated wireless/blue tooth components and antennas for sending real time data/analytics.

Referring now to FIGS. 2-10, detailed views of the process steps for a technique of manufacturing a packaged module 10 are provided, according to an embodiment of the invention. The technique illustrated in FIGS. 2-10 is shown and described for manufacturing a packaged module 10 as shown in FIG. 1 (i.e., including a sensor 12, wireless chip set 14, 16, and dry film battery 18), however, it is recognized that the described process is applicable to manufacturing packaged modules that embed sensors, semiconductor devices, and/or communications devices of various configurations.

Figure 2:
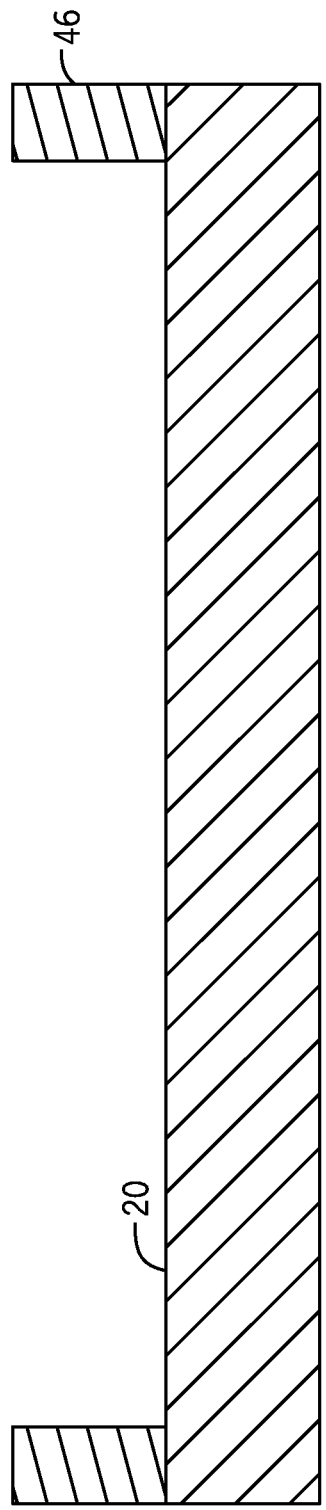

Referring to FIG. 2, the build-up process of packaged module 10 begins with the placement and attachment of a dielectric layer 20 onto a frame structure 46, with the frame structure 46 being bonded to either side of the dielectric layer, in a roll-to-roll (e.g., "35 mm" strip format with tracks or keep out areas for handling) or frame format, in a manner known in the art. The dielectric layer 20 is in the form of a lamination or film and is placed on frame structure 46 to provide stability during the build-up process of the packaged module 10. According to embodiments of the invention, the dielectric layer 20 may be formed of one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material.

Figure 3:
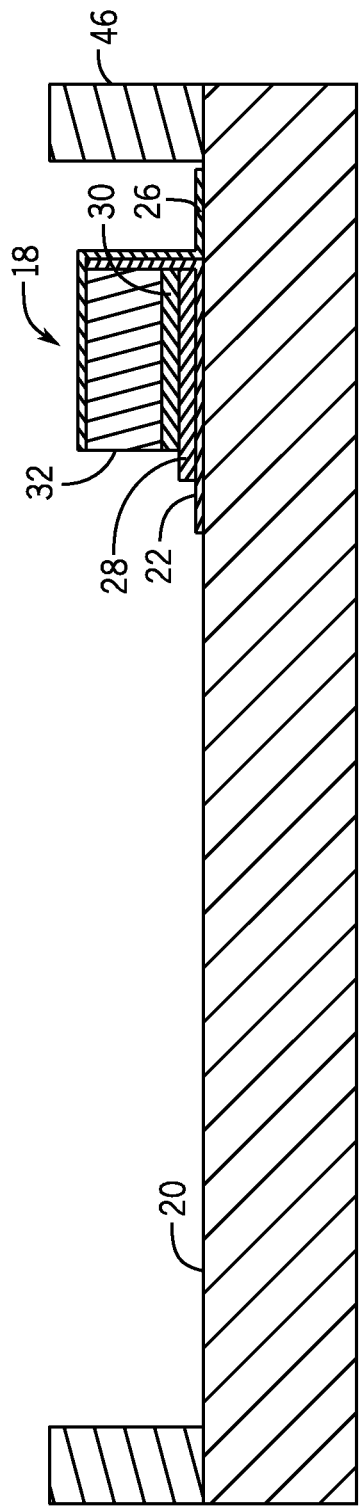

As shown in FIG. 3, upon securing of dielectric layer 20 to frame structure 46, a dry film battery 18 is provided on dielectric layer 20. In an exemplary embodiment, the dry film battery 18 is formed/fabricated directly onto the dielectric layer 20 however, it is recognized that other embodiments of the invention may be directed to packages where an already fabricated battery 18 is placed onto dielectric layer 20. In fabricating the battery 18, in an embodiment where the battery 18 is in the form of a thin film lithium microbattery, a lithium anode electrode 22 is initially deposited onto the dielectric layer 20, such as via a sputtering application. Upon depositing of the anode 22 onto dielectric layer 20, a build-up application of various battery layers is next applied onto the anode 22—with the build-up application including depositing (e.g., sputtering) of a base layer of lithium 28, depositing of a dry film electrolyte of LiPON 30, and depositing of a dry film electrolyte of $LiCoO_2$ 32. Upon depositing of this described stack of battery layers 28, 30, 32, a lithium cathode electrode 26 is then deposited and defined over the stacked layers of dry film electrolytes, with the cathode 26 also extending down a side of the stacked layers 28, 30, 32 and onto the dielectric layer 20. It is recognized that the fabrication of battery 18 described above may not constitute the full fabrication process and that additional process steps may be required, as would be recognized by one skilled in the art.

Subsequent to forming of the battery 18 on dielectric layer 20, and as shown in FIG. 4, an adhesive material 34 is applied onto the dielectric layer 20 on a same side thereof as which dry film battery 18 was formed on. In one embodiment, the adhesive material 34 is also applied over the dry film battery 18 to serve as a protective layer or encapsulant for the battery 18, although it is recognized that adhesive material 34 need not be applied over the protection (i.e., may rely only on electrically insulating substrate 36 for battery protection). Upon application of the adhesive 34, electronic components, such as MEMS type sensor 12, semiconductor device 14 and communications device 16, are then placed and attached face down (i.e., active side down) onto the adhesive 34 to secure the components onto dielectric layer 20, as shown in FIG. 5. A curing step is then performed to cure the adhesive 34 and secure the electronic components 12, 14, 16 to the adhesive 34 and to the dielectric layer 20.

Figure 6:
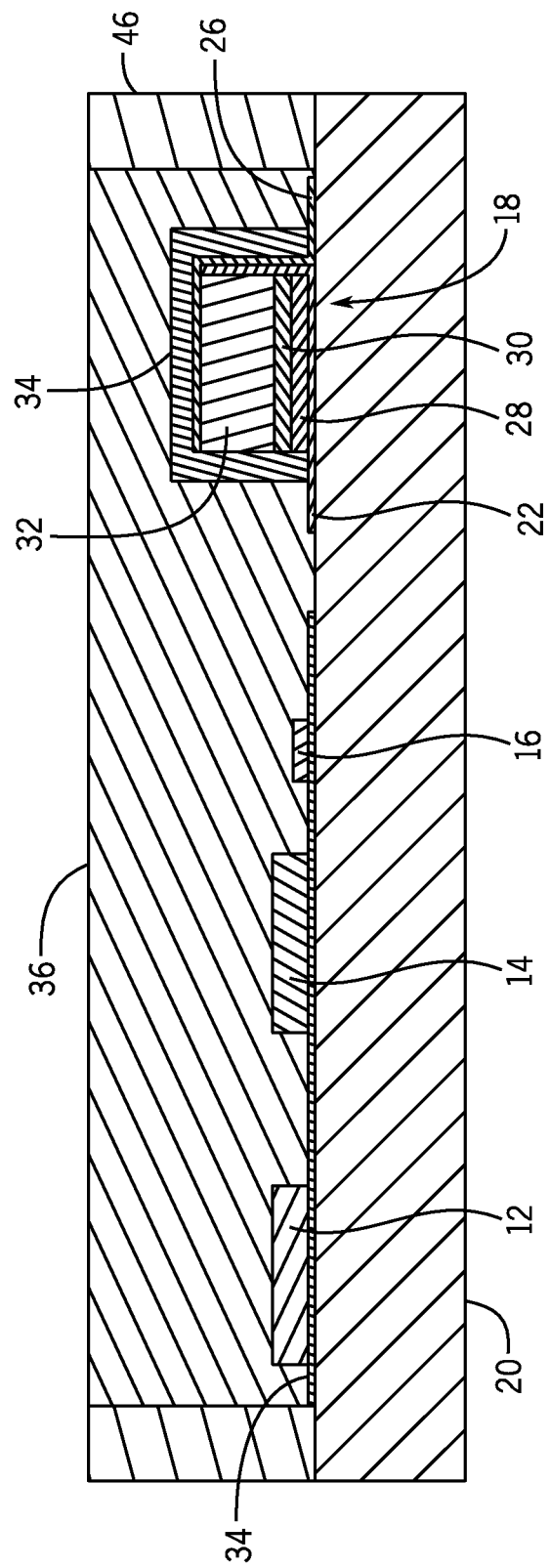

In a next step of the build-up process, and as shown in FIG. 6, an electrically insulating substrate 36 is applied so as to surround the electronic components 12, 14, 16 and battery 18. In the embodiment illustrated in FIG. 6, the electrically insulating substrate 36 is applied as a dielectric "overmold" encapsulant, such as a polymeric encapsulant or epoxy. However, as previously explained, the electrically insulating substrate 36 could instead be provided/formed as a stack of dielectric layers. In either embodiment, the electrically insulating substrate 36 is formed to present a level or planar back surface for the packaged module 10 that enables mounting of the module to a desired device, as will be explained in more detail below.

Figure 7:
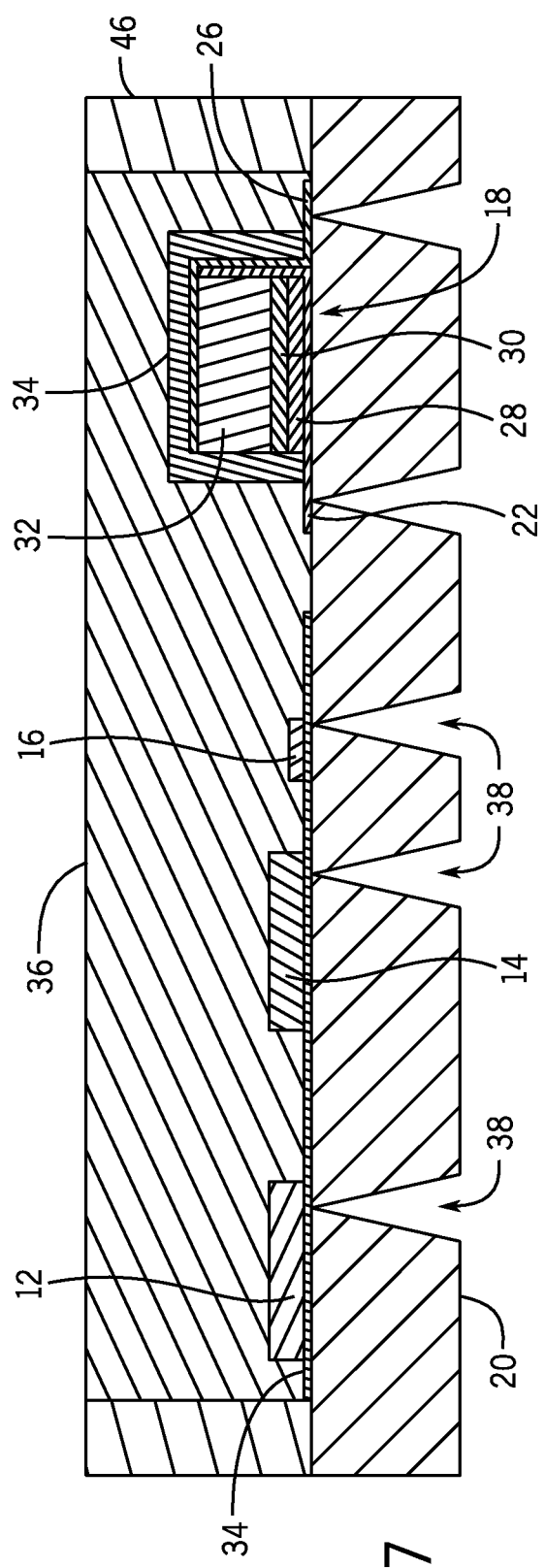

Referring now to FIG. 7, upon over molding and encapsulating the electronic components 12, 14, 16 and battery 18, a plurality of vias 38 is formed through the dielectric layer 20 (and adhesive layer 34) to the terminals 22, 26 of battery 18 and to I/O pads of the electronic components 12, 14, 16. The vias 38 are blind vias formed down to the terminals and I/Os of the battery 18 and electronic components 12, 14, 16 for forming an electrical connection thereto, such as by using an alignment drilling to see the components/battery.

According to embodiments of the invention, the vias 38 may be formed by way of a laser ablation or laser drilling process, plasma etching, photo-definition, or mechanical drilling processes. While the formation of vias 38 through dielectric layer 20 is shown in FIG. 7 as being performed after attachment of electronic components 12, 14, 16 and formation of dry film battery 18 on dielectric layer 20, it is recognized that the formation of vias 38 could be performed prior to placement of components 12, 14, 16 and formation of battery 18 onto dielectric layer 20 (i.e., onto adhesive layer 34). That is, depending on constraints imposed by via size, vias 38 could first be formed in dielectric layer 20 prior to attachment of electronic components 12, 14, 16 and formation of dry film battery 18 on dielectric layer 20, with the vias 38 being formed at locations corresponding to a plurality of terminals and/or connection pads formed on the electronic components 12, 14, 16 and battery 18. Furthermore, a combination of pre- and post-drilled vias could be employed as needed.

Figure 8:
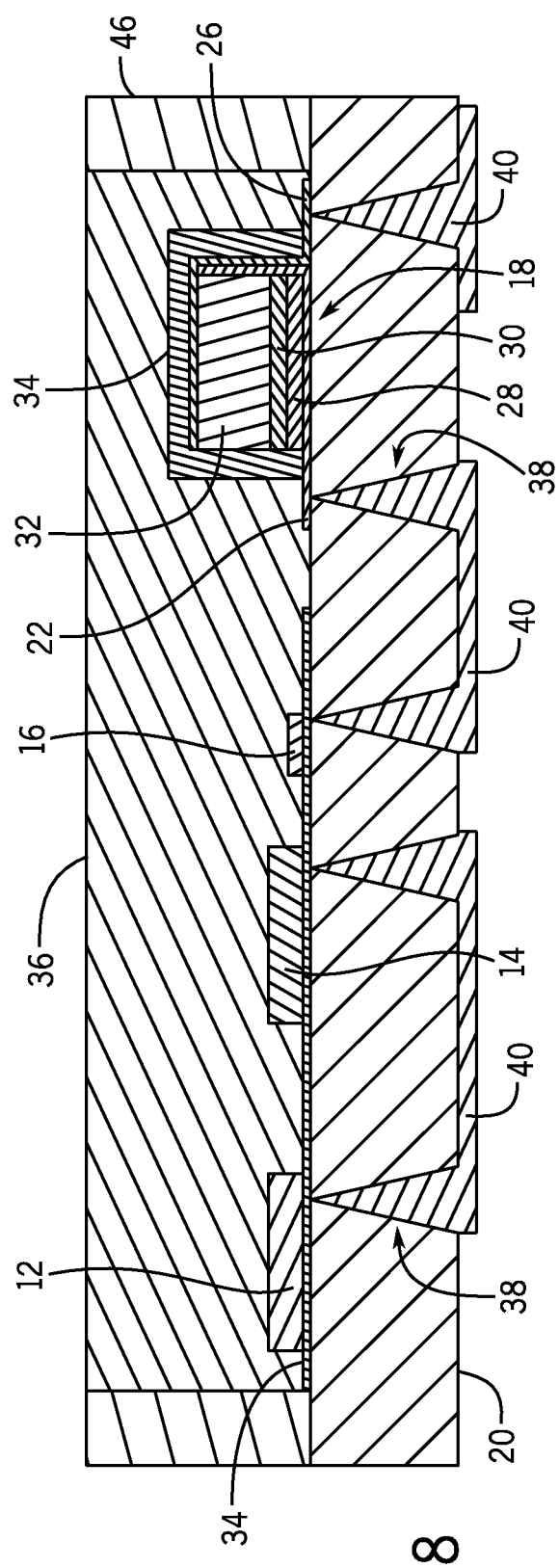

Once the vias 38 have been formed down to terminals 22, 26 of battery 18 and to I/O pads of the electronic components 12, 14, 16, and upon completion of a cleaning of the vias 38 (such as through a reactive ion etching (RIE) desoot process), metal interconnects 40 are then formed in the packaged module 10, as shown in FIG. 8. According to one embodiment, the metal interconnects 40 may be formed through a combination of sputtering and electroplating applications, although it is recognized that other methods of metal deposition (e.g., electroless or electrolytic plating) could also be used. For example, a titanium, TiW or palladium adhesion layer and copper seed layer may first be applied in vias 38 by way of a sputtering or electroless plating process, followed by an electroplating process that fills the vias 38 and increases a thickness of (i.e., "plating up") the copper to a desired level. In one embodiment, a patterning and etching is then subsequently performed on the applied copper to form interconnects 40 having a desired shape. While application of a continuous copper layer and subsequent patterning and etching of the continuous copper layer is described here for forming interconnects 40, it is recognized that patterning and plating of the interconnects 40 via a semi-additive plating process could instead be employed to form the interconnects 40.

Figure 9:
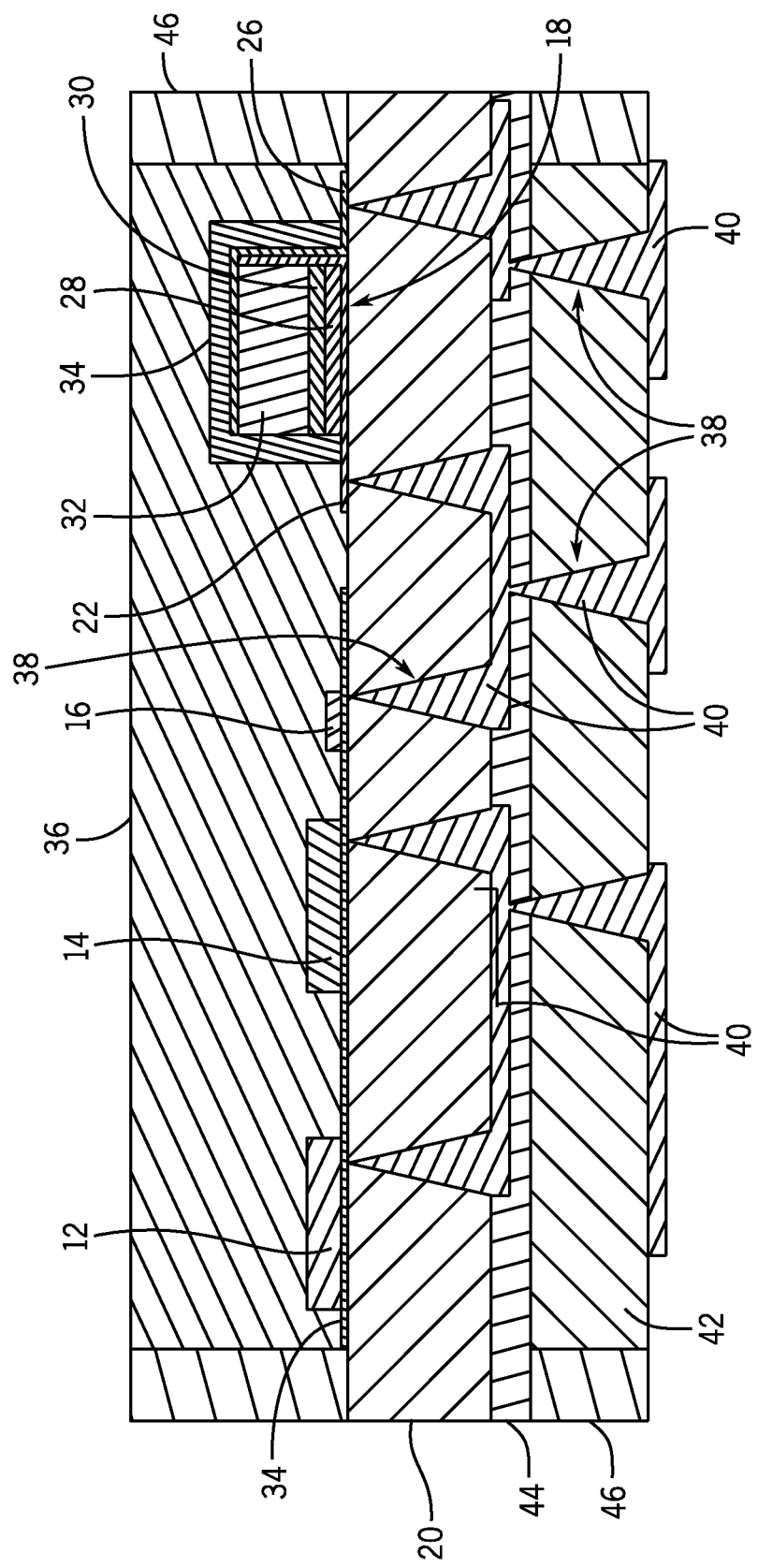

According to one embodiment, and as shown in FIG. 9, additional routing layers can be applied to packaged module 10 in a next step of the build-up process. That is, upon forming of the metal interconnects 40 in packaged module 10, one or more additional dielectric layers—such as dielectric layer 42 in FIG. 9—may be added to the packaged module 10, with an adhesive 44 being used to attached dielectric layer 42 to dielectric layer 20. As shown in phantom in FIG. 9, it is recognized that each additional dielectric layer 42 would be mounted on a frame before being added to the previous layer. In one embodiment, the dielectric layer 42 is formed of a material identical to that of dielectric layer 20, and thus layer may be one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material. Vias 38 and metal interconnects 40 are then subsequently formed in/on the added dielectric layer 42 by way of the via formation and metal interconnect plating/patterning processes described in detail above. Additionally, in an embodiment where the electrically insulating substrate 36 is provided/formed as a stack of dielectric layers (i.e., dielectric layers 43 in FIG. 1B), it is recognized that vias 38 and metal interconnects 40 could formed in/on the added dielectric layers by way of the via formation and metal interconnect plating/patterning processes previously described.

Figure 10:
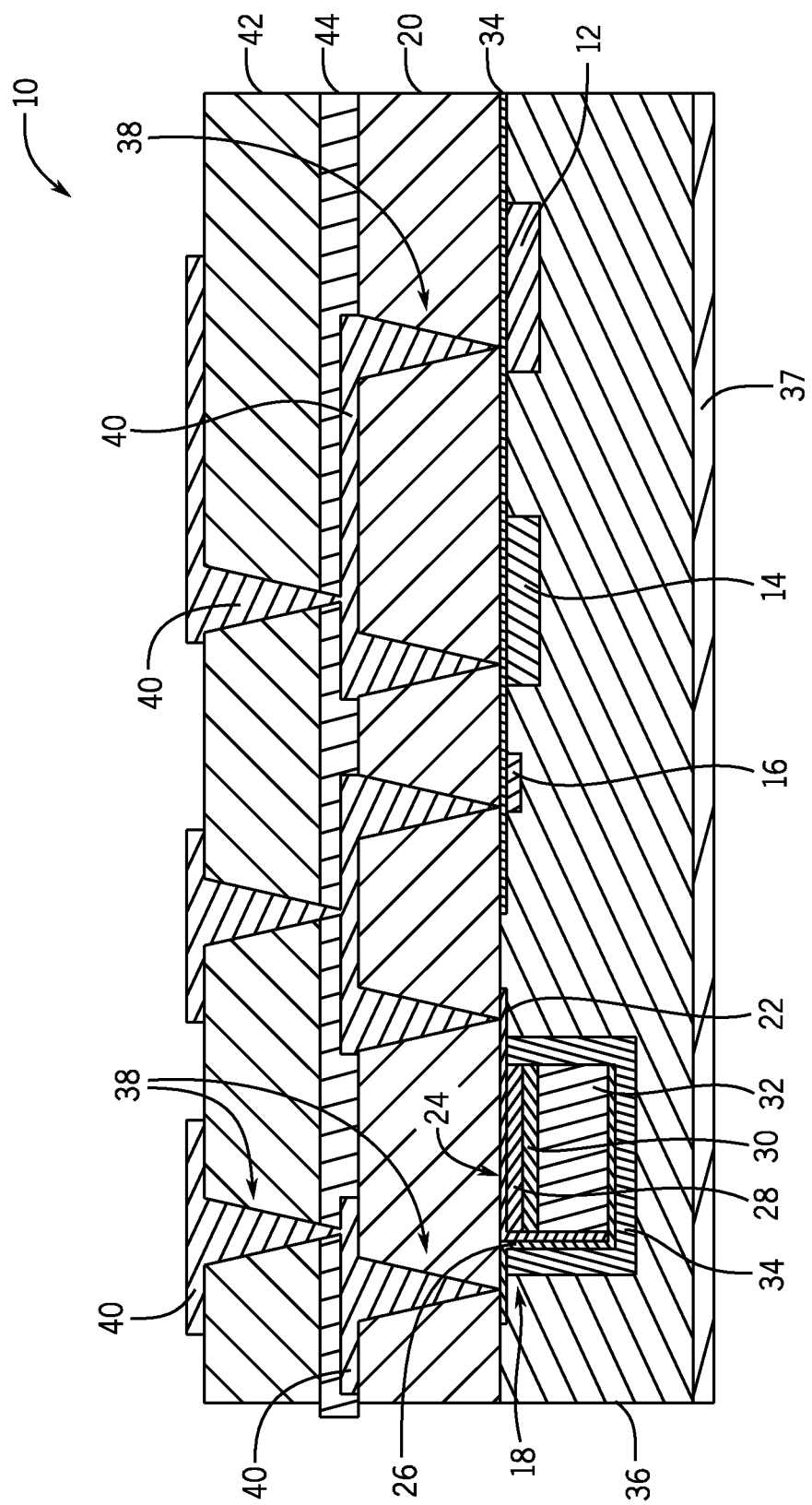

Upon the addition of any desired additional dielectric layer(s) 42 (and/or layers 43) and the subsequent formation of vias 38 and metal interconnects 40 in/on the dielectric layer(s) 42, the packaged module 10 is removed from the processing frame or panel 46, and a final step of the module fabrication process may be performed by applying an outer adhesive layer 37 onto the back side of the electrically insulating substrate 36, as shown in FIG. 10. Addition of the adhesive layer 37 enables the packaged module 10 to be used in "peel and stick" applications—where the packaged module 10 may be applied onto a desired device with which the packaged module 10 is to be employed. While FIG. 10, illustrates application of the adhesive layer 37 onto the back side of the packaged module 10, it is recognized that an adhesive layer could additionally/alternatively be applied onto a side surface of the packaged module 10 or the front surface of the packaged module 10.

Figure 11:
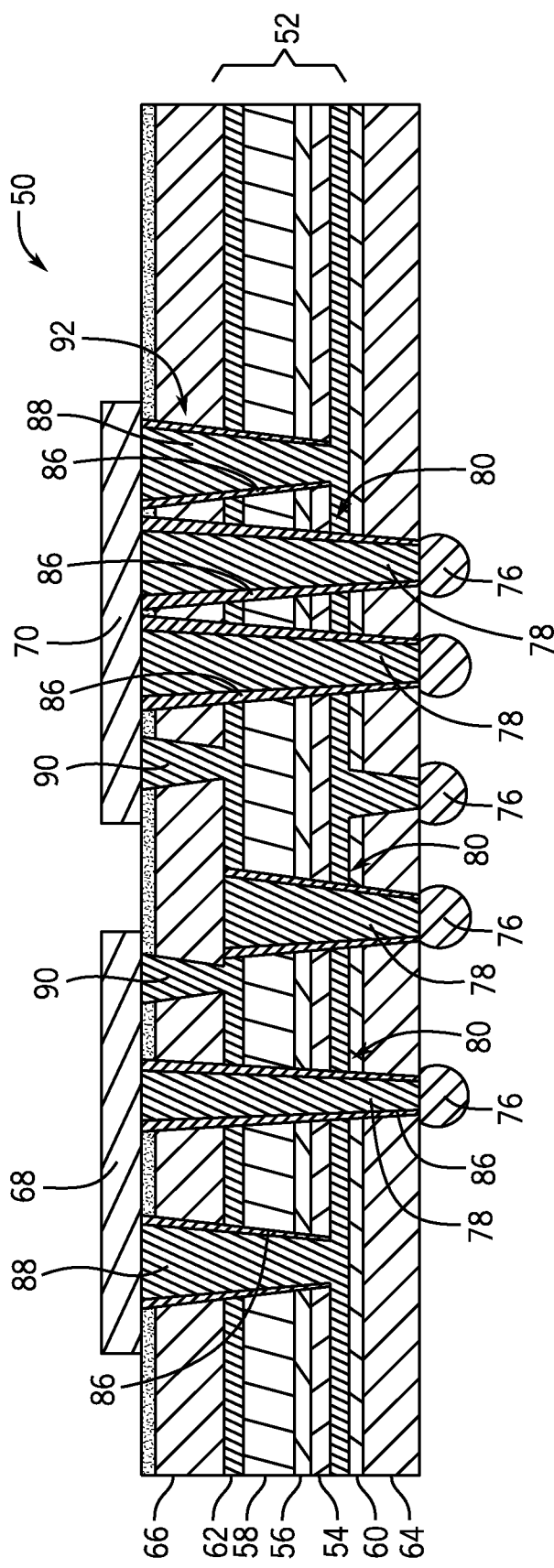
FIG. 11 is a schematic cross-sectional side view of a packaged module according to another embodiment of the invention.

While FIGS. 1A and 1B and FIGS. 2-10 show and describe a packaged module 10 where a dry film battery 18 is formed/provided in a selected location on dielectric substrate 20 and supported thereby, it is recognized that an alternative embodiment of a packaged module may be formed where a dry film battery is formed as part of an overall substrate of the module. Referring now to FIG. 11, a packaged module 50 is illustrated according to another embodiment. In the embodiment of FIG. 11, it can be seen that a dry film battery 52 is provided in packaged module 50 that forms part of the package substrate. More specifically, a dry film battery 52 having a stacked construction similar to previously described—e.g., stacked layers of lithium 54, LiPON 56 and $LiCoO_2$ 58, with lithium anode and cathode electrodes 60, 62—is formed between a pair of dielectric substrate layers 64, 66 that provide support, protection, and connection redistribution for the packaged module 50, with the dry film battery 52 being formed so as to fill an entirety of an area/volume between the pair of dielectric substrate layers 64, 66 and cover a surface of each of the dielectric substrate layers 64, 66. While a lithium dry cell battery 52 is illustrated in FIG. 11, it is recognized that other thin film battery materials and layers could be substituted for the specific battery materials/layers illustrated in FIG. 11, according to additional embodiments of the invention.

With regard to dielectric substrate layers 64, 66, each of the dielectric layers is formed of a material that is chosen to provide mechanical and temperature stability to vias during use and frame processing, as well as provide suitable dielectric properties and voltage breakdown strength and processability for via formation and power overly (POL) processing. Accordingly, the dielectric substrate layers 64, 66 may be formed of one a plurality of dielectric materials, such as Kapton®, Ultem®, polytetrafluoroethylene (PTFE), Upilex®, polysulfone materials (e.g., Udel®, Radel®), mylar, or another polymer film, such as a liquid crystal polymer (LCP) or a polyimide material, according to embodiments of the invention.

Dielectric substrate layers 64, 66 may include one or more electronic components mounted thereon, such as two components 68, 70 on layer 66, as shown in FIG. 11. The electronic components 68, 70, may be in the form of MEMS type sensors, semiconductor devices and/or communications devices that, according to one embodiment, may along with dry film battery 52 form a self-powered packaged electronics module 50 that provides a number of functions or sensing applications (e.g., IoT applications).

As shown in FIG. 11, each of electronic components 68, 70, is electrically connected to I/O connections 76 formed on an outer facing surface of dielectric substrate layer 64. For electronic components 68, 70, such electrical connections between the components 68, 70 and the I/Os 76 are provided by way of metal interconnects 78 formed within vias 80 that extend through the dry film battery 52 and through dielectric substrate layer 64. With respect to the vias 80 and metal interconnects 78 formed through dry film battery 52 and dielectric substrate layer 64, it is recognized that such vias 80 must be formed to electrically isolate/insulate the metal interconnects 78 therein from the battery 52. Accordingly, the vias include a passivation layer 86 formed along a surface thereof, with the metal interconnects 78 filling-in the vias 80 within passivation layer 86 such that the metal interconnects 78 are electrically isolated/insulated from the battery 52 While not shown in FIG. 11, it is recognized that, in one embodiment, vias and corresponding interconnects may also be formed down to the battery 52 to provide for charging the battery, such that packaged module 50 may be in the form of a self-sustaining powered module or sensor.

As also shown in FIG. 11, additional metal interconnects 88, 90 are formed to electrically couple the electronic components 68, 70 to the anode and cathode electrodes 60, 62 of dry film battery 52, such that battery 52 may provide power to these components 68, 70 (i.e., components are power consuming devices, such as semiconductor devices, for example). For the metal interconnects 88 that electrically couple the electronic components 68, 70 to the anode 60, such interconnects 88 extend through vias 92 formed in/through the dry film battery 52 (i.e., through cathode 62 and layers 54, 56, 58). It is again recognized that vias 92 must be formed to electrically isolate/insulate the metal interconnects 88 therein from the battery 52 and thus vias 92 also include a passivation layer 86 formed along a surface thereof, with the metal interconnects 88 filling-in the vias 92 within passivation layer 86 such that the metal interconnects 88 are electrically isolated/insulated from the cathode 62 and layers 54, 56, 58.

A packaged module 50 is thus provided having a battery 52 integrated therein that is formed as part of an overall substrate of the packaged module 50. The packaged module 50 is thus in the form of a self-powered module with very low losses and a thin profile. The packaged module 50 can be designed to provide a number of functions or sensing applications, such as for IoT applications where the module includes integrated wireless/blue tooth components and antennas for sending real time data/analytics. The integrated battery 18 provides the function of a substrate and can "fill in" all inactive spaces in the package, with it being possible to integrate electronic components on both sides of the battery 18.

Beneficially, embodiments of the invention thus provide a packaged electronics module having a dry film battery incorporated therein. By incorporating of the battery into the packaged module, a self-powered module is provided that eliminates the need to connect to an externally mounted battery. Incorporation of the battery thus lowers power losses associated with operating the module and provides a thin module having a small form factor. The self-powered packaged electronics module can be manufactured within and as part of the overall package build-up process in a panel format, so as to reduce fabrication costs of the battery and associated module. The self-powered packaged electronics module may provide a number of functions or sensing applications for IoT applications, including the module integrating wireless/Bluetooth components and antennas for sending real time data/analytics, for example. High temperature applications, RF high frequency operation, a flexible/conformal structure, and "peel and stick" applications are still additional benefits provided by the self-powered packaged electronics module. Other envisioned benefits include embodiments of the invention incorporating energy harvesting devices into the packaged electronics module to provide for recharging of the dry film battery so as to provide a self-sustaining powered sensor, such as might be useful in non-serviceable or remote areas.

Therefore, according to one embodiment of the invention, a packaged electronics module includes a first dielectric layer, at least one electronic component attached to or embedded in the first dielectric layer, a dry film battery formed on the first dielectric layer, and metal interconnects mechanically and electrically coupled to the at least one electronic component and the dry film battery to form electrical interconnections thereto.

According to another embodiment of the invention, a method of manufacturing a packaged electronics module includes providing a first dielectric layer, forming a dry film battery directly onto the first dielectric layer, attaching one or more electronic components to the first dielectric layer, forming a plurality of vias through the first dielectric layer, and forming metal interconnects in the plurality of vias formed through the first dielectric layer, the metal interconnects forming electrical interconnections to the one or more electronic components and to the dry film battery.

According to yet another embodiment of the invention, a packaged electronics module includes a dielectric layer having a first surface and a second surface and a plurality of electronic components attached to the dielectric layer on the first surface, the plurality of electronic components including a MEMS type sensor and a communications chip set including a semiconductor device and a communications device. The packaged electronics module also includes a dry film battery attached to the dielectric layer on the first surface and metal interconnects formed in a plurality of vias formed through the dielectric layer and out onto the second surface of the dielectric layer, the metal interconnects being mechanically and electrically coupled to the MEMS type sensor the communications chip set. The packaged electronics module further includes an electrically insulating substrate applied onto the first surface of the dielectric layer and over the MEMS type sensor the communications chip set, so as to embed the MEMS type sensor the communications chip set therein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:
1. A packaged electronics module comprising:
    a first dielectric layer;
    at least one electronic component attached to or embedded in the first dielectric layer;
    a dry film battery provided on the first dielectric layer;

metal interconnects mechanically and electrically coupled to the at least one electronic component and the dry film battery to form electrical interconnections thereto; and an adhesive layer applied onto the first dielectric layer such that the at least one electronic component is attached to the first dielectric layer via the adhesive layer, with a portion of the adhesive layer positioned between the at least one electronic component and the first dielectric layer.

2. The packaged electronics module of claim 1 wherein the adhesive layer is applied over the dry film battery so as to substantially surround the dry film battery and provide a protective coating thereabout.

3. The packaged electronics module of claim 1 further comprising an electrically insulating substrate formed over the at least one electronic component and the dry film battery on a first surface of the first dielectric layer.

4. The packaged electronics module of claim 3 wherein the electrically insulating substrate comprises one of a dielectric overmold encapsulant and a stack of dielectric layers.

5. The packaged electronics module of claim 4 further comprising an outer adhesive layer applied onto a back surface of the electrically insulating substrate that is opposite the first dielectric layer, the back surface of the electrically insulating substrate comprising a level or planar surface onto which the outer adhesive layer is applied.

6. The packaged electronics module of claim 1 wherein the dry film battery comprises:
an anode formed directly onto the first dielectric layer;
a stack of battery material layers formed onto the anode; and
a cathode formed over the stack of battery material layers;
wherein the metal interconnects form electrical interconnections to the anode and the cathode.

7. The packaged electronics module of claim 1 further comprising a plurality of vias formed through the first dielectric layer to the at least one electronic component and the dry film battery, the metal interconnects formed in the plurality of vias and out onto a surface of the first dielectric layer.

8. The packaged electronics module of claim 1 wherein the at least one electronic component comprises a plurality of electronic components, the plurality of electronic components including:
a microelectromechanical system (MEMS) type sensor;
a semiconductor device; and
a communications device;
wherein the MEMS type sensor, semiconductor device, and communications device collectively form a means for parameter sensing and wireless data communication.

9. The packaged electronics module of claim 1 further comprising an antenna structure formed in or on the first dielectric layer.

10. The packaged electronics module of claim 1 further comprising a second dielectric layer positioned such that the dry film battery is sandwiched between the first dielectric layer and the second dielectric layer, the dry film battery filling an entirety of a volume between the first and second dielectric layers;

wherein a plurality of vias is formed through the dry film battery and the second dielectric layer; and wherein a portion of the metal interconnects is formed in the plurality of vias that extend through the dry film battery and the second dielectric layer, with a passivation layer being coated within the plurality of vias to electrically insulate this portion of the metal interconnects from the dry film battery.

11. A packaged electronics module comprising:
a dielectric layer having a first surface and a second surface;
a plurality of electronic components attached to the dielectric layer on the first surface, the plurality of electronic components comprising:
a microelectromechanical system (MEMS) type sensor; and
a communications chip set including a semiconductor device and a communications device;
a dry film battery attached to the dielectric layer on the first surface;
metal interconnects formed in a plurality of vias formed through the dielectric layer and out onto the second surface of the dielectric layer, the metal interconnects being mechanically and electrically coupled to the MEMS type sensor and the communications chip set;
an electrically insulating substrate applied onto the first surface of the dielectric layer and over the MEMS type sensor and the communications chip set, so as to embed the MEMS type sensor and the communications chip set therein; and
an adhesive layer applied onto the first surface of the dielectric layer that attaches the plurality of electronic components to the dielectric layer, the adhesive layer also being applied over the dry film battery so as to substantially surround the dry film battery and provide a protective coating thereabout.

12. A packaged electronics module comprising:
a first dielectric layer;
at least one electronic component attached to or embedded in the first dielectric layer;
a dry film battery provided on the first dielectric layer;
metal interconnects mechanically and electrically coupled to the at least one electronic component and the dry film battery to form electrical interconnections thereto; and
a second dielectric layer positioned such that the dry film battery is sandwiched between the first dielectric layer and the second dielectric layer, the dry film battery filling an entirety of a volume between the first and second dielectric layers;
wherein a plurality of vias is formed through the dry film battery and the second dielectric layer; and
wherein a portion of the metal interconnects is formed in the plurality of vias that extend through the dry film battery and the second dielectric layer, with a passivation layer being coated within the plurality of vias to electrically insulate this portion of the metal interconnects from the dry film battery.

* * * * *